United States Patent [19]
Burke et al.

[11] Patent Number: 6,051,495
[45] Date of Patent: Apr. 18, 2000

[54] SEASONING OF A SEMICONDUCTOR WAFER POLISHING PAD TO POLISH TUNGSTEN

[75] Inventors: Peter A. Burke; Kevin D. Shipley; Peter J. Beckage, all of Austin, Tex.

[73] Assignee: Advanced Micro Devices, Inc., Sunnyvale, Calif.

[21] Appl. No.: 08/962,431

[22] Filed: Oct. 31, 1997

[51] Int. Cl.[7] ................................. H01L 21/463
[52] U.S. Cl. .................. 438/685; 438/633; 438/692; 451/41; 451/56
[58] Field of Search .................... 438/685, 633, 438/691, 692; 451/56, 41

[56] References Cited

U.S. PATENT DOCUMENTS

| 4,031,278 | 6/1977 | Patel . |
| 5,244,534 | 9/1993 | Yu et al. . |
| 5,674,352 | 10/1997 | Yu et al. . |
| 5,707,492 | 1/1998 | Stager et al. . |
| 5,890,951 | 4/1999 | Vu ............................................. 451/56 |

Primary Examiner—Caridad Everhart
Attorney, Agent, or Firm—Skjerven, Morrill, MacPherson, Franklin & Friel, L.L.P.; David G. Dolezal

[57] ABSTRACT

A tungsten prepper for seasoning a semiconductor wafer polishing pad to polish tungsten on a semiconductor wafer. The prepper includes a support device having a first surface and a seasoning layer attached to the first surface of the support device. The seasoning layer is made of a seasoning material for seasoning a polishing pad to polish tungsten. In one embodiment, the seasoning layer is flame sprayed on the surface of the support device. In another embodiment, the tungsten is inserted into notches in the surface. The seasoning material includes tungsten, and in some embodiments, an adhesion promoter such as nickel. The prepper can be attached to a conditioning arm of a Chemical Mechanical Polisher. The prepper can be used to season a new polishing pad until the tungsten polishing rate of the pad is above 4000 angstroms per minute. The prepper can also include conditioners to condition a pad while seasoning the pad.

57 Claims, 6 Drawing Sheets

SEASONING OF A SEMICONDUCTOR WAFER POLISHING PAD TO POLISH TUNGSTEN

BACKGROUND OF THE INVENTION

1. Field of the Invention

This invention relates generally to the manufacture of semiconductor devices and more specifically to seasoning and conditioning a polishing pad to polish tungsten on semiconductor wafers.

2. Description of the Related Art

Some of today's semiconductors include tungsten structures. Some advantages of using tungsten in semiconductors is that tungsten exhibits excellent resistance to electromigration effects, hillock formation, and humidity-induced corrosion. One example of a tungsten structure used in a semiconductor is a multilevel interconnect or plug. Another example of a tungsten structure used in a semiconductor is a local interconnect.

Tungsten Chemical Mechanical Polishing (CMP) is becoming increasingly important in the manufacturing of semiconductors as a technology to replace the reactive ion etchback (RIE) of blanket tungsten on a semiconductor wafer surface to form tungsten plugs.

With Tungsten CMP, the tungsten on the wafer is polished with the use of a polishing pad. Some types of polishing pads used to polish tungsten on semiconductor wafers include the SUBA 500, the IC 1000, and the IC 1400 manufactured by RODEL, INC., of Delaware. The tungsten polishing rates of a pad depend upon a chemical reaction. For a new polishing pad that is recently installed on a polisher, the tungsten polishing rates are relatively low in comparison to a "used" polishing pad. A new polishing pad lacks the chemical seasoning of a used pad and consequently does not attain a suitable chemical reaction of a used pad. This chemical reaction aids in polishing tungsten on a semiconductor wafer. Consequently, it is often necessary to "break in" or season a new polishing pad for the new polishing pad to have tungsten polishing rates within a specified range.

One method for breaking in or seasoning a new polishing pad is to polish multiple dummy wafers having an outer layer including tungsten on the circuit side or front side of the wafer with the pad until the polishing rates are elevated within specifications. For example, one range of acceptable tungsten polishing rates is 4000 angstroms to 6000 angstroms per minute for a CMP tool type polisher such as the CMP-V or the AUIRIGA manufactured by SPEEDFAM. A disadvantage of seasoning a polishing pad with dummy wafers is the expense and time consumed in processing the several wafers that may be required to bring the tungsten polishing rates of a pad within acceptable levels.

What is needed is an improved way to season a pad for polishing tungsten.

SUMMARY OF THE INVENTION

It has been discovered that seasoning a polishing pad with a prepper having a layer of seasoning material advantageously increases the tungsten polishing rates of a newly installed polishing pad.

In one aspect, the invention includes an apparatus for seasoning a polishing pad for polishing tungsten. The apparatus includes a support device having a first surface and a seasoning layer attached to the first surface of the support device. The seasoning layer has a thickness greater than approximately 1 mil. The seasoning layer is made of a seasoning material for seasoning a polishing pad to polish tungsten.

In another aspect, the invention includes a method for making a prepper for seasoning a polishing pad. The method includes providing a support device having a first surface and attaching a seasoning layer having thickness of at least 1 mil to the first surface.

In another aspect, the invention includes a method of chemical mechanical polishing of tungsten on a semiconductor wafer. The method includes seasoning a polishing pad with a prepper having a seasoning layer of a seasoning material of at least 1 mil thick and polishing tungsten on a first semiconductor wafer with the polishing pad.

In another aspect, the invention includes an apparatus for conditioning a polishing pad. The apparatus includes a conditioner and a seasoning layer attached to the apparatus. The seasoning layer is made of a seasoning material. The seasoning layer seasons the polishing pad to polish tungsten when the conditioner is conditioning a polishing pad.

In another aspect, the invention includes a Chemical Mechanical Polisher. The polisher includes a polishing pad and a carrier for holding at least one semiconductor wafer to be polished by the polishing pad. The polisher also includes a conditioning arm and a prepper attached to the conditioning arm. The prepper includes a seasoning layer for seasoning the polishing pad to polish tungsten.

In another aspect, the invention includes a method of seasoning a new polishing pad to polish tungsten. The method includes seasoning a new polishing pad with a prepper having a seasoning layer until the tungsten polishing rate of the pad is above 4000 angstroms per minute.

Seasoning a used polishing pad that has been idle for a period of time with a prepper having a layer of seasoning material advantageously increases the polishing rates for the polishing pad.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

The following sets forth a detailed description of the best contemplated mode for carrying out the invention. The description is intended to be illustrative of the invention and should not be taken to be limiting.

Figure 1:
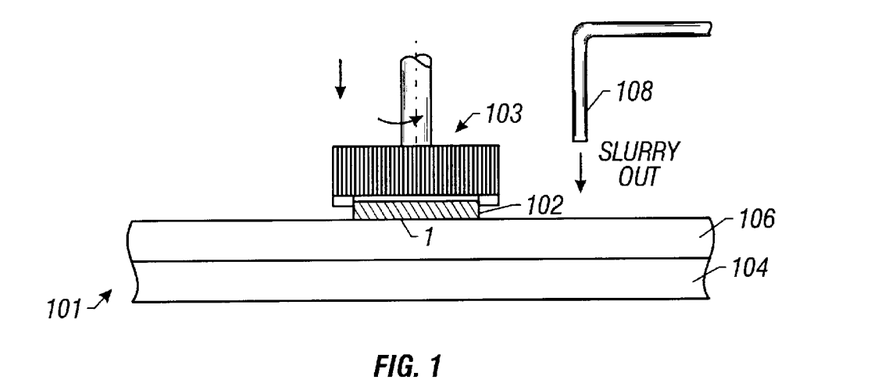
FIG. 1 is a side view of one embodiment of a wafer being polished with a polishing pad.

FIG. 1 shows one embodiment of a semiconductor wafer being polished with a semiconductor wafer polishing pad. Wafer 102 includes a semiconductor substrate with layers of conductive, semiconductive, and dielectric materials formed on the portion of the wafer 102 adjacent to the polishing pad 106 as shown in FIG. 1. In the embodiment shown, wafer 102 has a layer of tungsten including excess tungsten deposited on its surface located adjacent to and contacting pad 106. In the embodiment shown, pad 106 is a SUBA 500 pad manufactured by RODEL that covers table 104 of the polisher, which in the embodiment shown, is a CMP tool type of polisher. Semiconductor wafer 102 is secured to a carrier 103. To polish or planarize the wafer 102 and thereby remove the excess tungsten, the circuit surface of wafer 102 or the surface adjacent to pad 106 is forced downward by carrier 103 against the top surface of pad 106, relative to the view shown in FIG. 1. Both wafer 102 and table 104 with attached pad 106 are rotated with respect to each other to planarize or remove the excess tungsten on the circuit surface of wafer 102. A slurry is deposited or pumped on the pad 106 through pipe 108 to aid in the polishing of wafer 106. In one embodiment the slurry contains an oxidizing agent for tungsten such as ferric nitrate and abrasive particles such as alumina particles that aid in the mechanical abrasion of the wafer to remove the excess tungsten. In other embodiments, the polisher may have multiple carriers for polishing more than one semiconductor wafer at a time.

Figure 11:
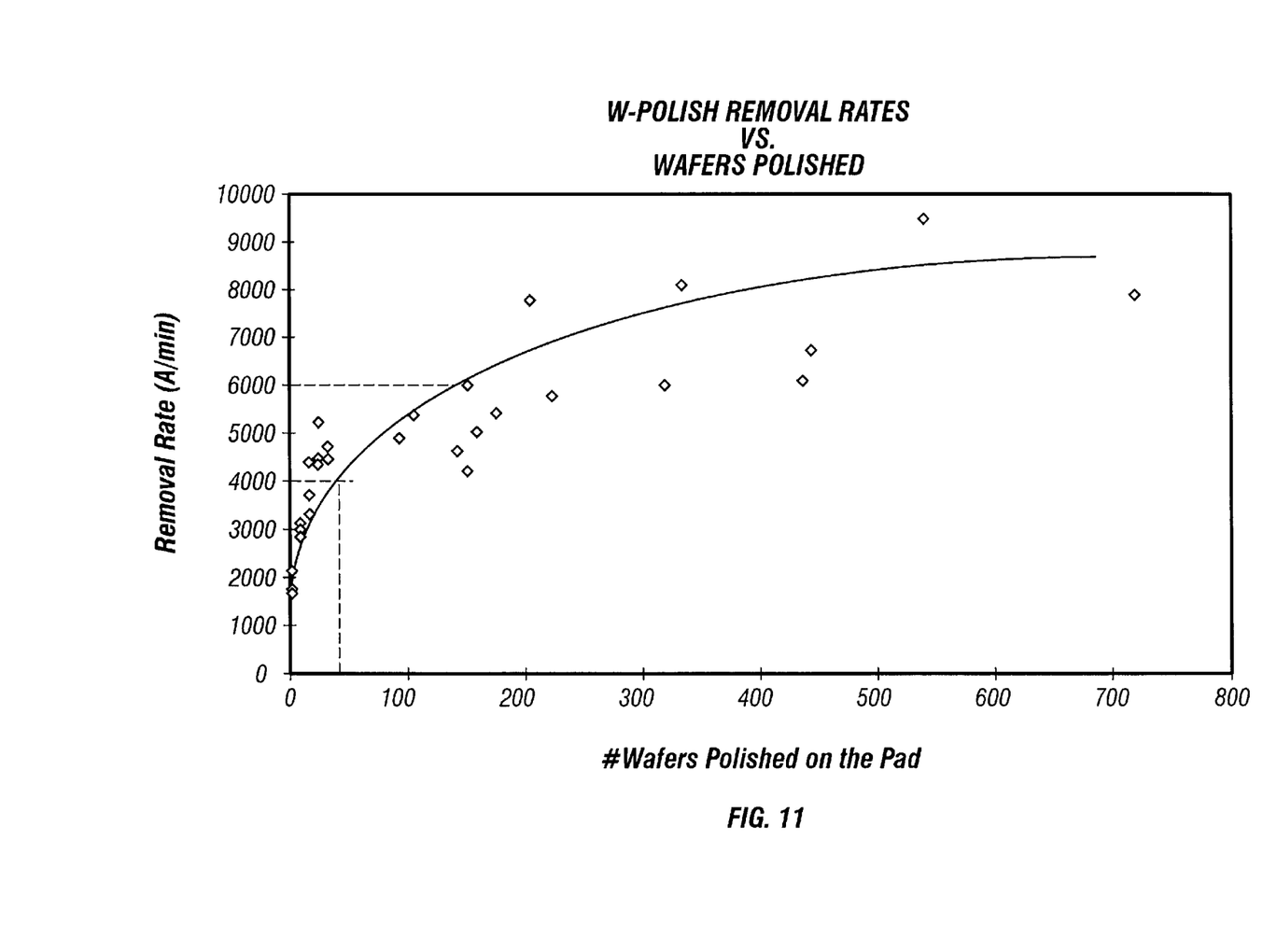
FIG. 11 is a graph showing tungsten polishing rates of a polishing pad.

FIG. 11 is a graph of the measured tungsten polishing rates of a polishing pad. The tungsten polishing rates for a new pad are much lower than rates after the pad has polished several wafers. As shown in FIG. 11, with each wafer that a new pad polishes tungsten, the tungsten polishing rates for the pad increase since the removed tungsten and tungsten oxides stay on the pad to chemically season the pad and thereby increase the polishing rate of the pad.

The tungsten polishing rates of a used pad drop if a pad is idle for a period of time such as 15 minutes. However, this period of time varies depending upon activity occurring on the pad during an idle period such as whether water is flowing on the pad. Each wafer polished after an idle period generally increases the tungsten polishing rate of the pad.

When polishing a batch of semiconductor wafers, it is desirable for the tungsten polishing rates of a pad to be within a specified range, which in one embodiment is between 4000 angstroms to 6000 angstroms per minute. As shown in FIG. 11, a new pad typically polishes approximately 50 wafers to reach the specified polishing rate. Polishing only when the tungsten polishing rate is within a specified range ensures that the tungsten on each wafer of a wafer batch is polished to a specified planarized level.

Dummy wafers, similar to wafer 102 in FIG. 1, and having a layer of tungsten deposited on the circuit side of the wafer are used to season a polishing pad for polishing tungsten at a rate within a specified range. The dummy wafers are polished by a new pad to bring the tungsten polishing rates of the pad within the specified range. For example, the dummy wafer may have a layer of tungsten of approximately 5000 Angstroms on the circuit side or surface of the wafer 102 adjacent to pad 106 in FIG. 1. The dummy wafer is formed by chemical vapor deposition (CVD). During the tungsten polishing of the dummy wafer, the tungsten and tungsten byproducts removed by polishing increase the tungsten polishing rate of the pad. Several dummy wafers are typically used to bring the tungsten polishing rate of a new polishing pad within the specified range. In seasoning a polishing pad to polish tungsten with multiple dummy wafers, seasoning is periodically stopped to install each new dummy wafer. Using dummy wafers to season a polishing pad not only incurs the cost of the dummy wafers, but also increases the time needed to bring the tungsten polishing rate of the pad within the specified range.

Figure 2:
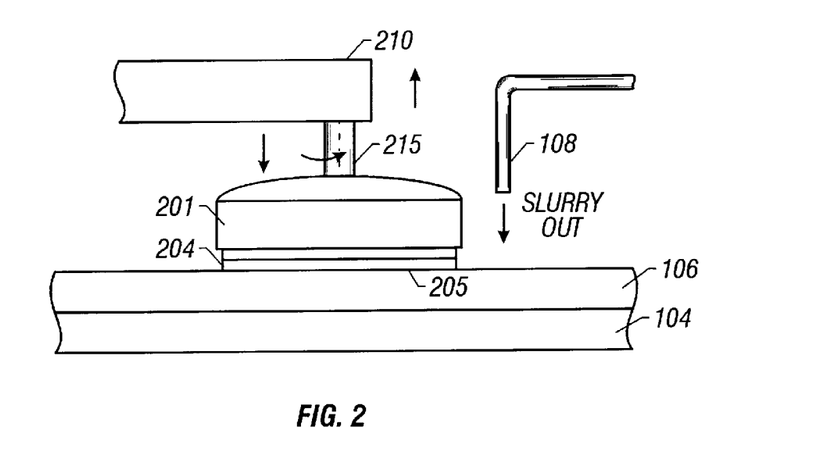
FIG. 2 is a side view of one embodiment of a prepper seasoning the polishing pad to polish tungsten.

FIG. 2 is a side view of one embodiment of a prepper seasoning a polishing pad. The prepper includes a support device 201. Attached to support device 201 is a layer of seasoning material 204. The support device is radially secured to an axis 215 with axis 215 attached to a conditioning arm 210 which can be moved to extend the prepper out over the pad 106.

In the embodiment shown in FIG. 2, the layer of seasoning material is made of a mixture of approximately 70% tungsten by weight and approximately 30% nickel by weight. However, in other embodiments, other seasoning materials may be used. For example, a material that includes up to 95% tungsten by weight may be used. In other embodiments, pure tungsten or relatively pure tungsten (greater than 95%) may be used as well. However, because relatively pure tungsten is very brittle and hard to work, other materials may be mixed with tungsten to make the seasoning material more workable. The seasoning material is made of a sufficient quantity of tungsten to provide the pad 106 with tungsten polishing by-product during seasoning.

To season pad 106 for polishing tungsten, the bottom surface 205 (or circuit surface) of the layer of seasoning material 204 is pressed downward against pad 106, relative to the view shown in FIG. 2. Both the seasoning layer 204 and pad 106 are rotated with respect to each other. Supporting device 201 and attached seasoning layer 204 are rotated around axis 215 by a motor or other rotating device in the conditioning arm 210. The prepper is typically rotated around pad 106 in a manner similar to that of a wafer being polished on pad 106 as shown in FIG. 1. In other embodiments, the table 104 and pad 106 are also rotated during this process. The prepper also moves laterally towards and away from the center of the pad when seasoning the polishing pad in some embodiments.

During the seasoning of the polishing pad 106, a slurry containing an oxidizing agent for tungsten and abrasive particles such as alumina, is pumped out of pipe 108 onto the top surface of the pad 106. This slurry aids in the removal of the tungsten from the seasoning layer 204 to chemically season the pad 106 and thereby raise the polishing rates. In one embodiment, the oxidizing agent oxidizes the tungsten on the circuit surface or bottom surface of the seasoning layer. The tungsten oxide is then abrased from the circuit surface onto the pad 106. In other embodiments, particles containing tungsten are also abrased from the circuit surface or bottom surface of the seasoning layer 204 to increase the amount of tungsten polishing byproduct on the polishing pad 106. Abrasion of the tungsten and tungsten compounds increases the tungsten polishing rate of the pad. Thus, tungsten from the prepper is removed by "polishing" the seasoning layer 204 of the prepper with the polishing pad 106.

The polishing pad 106 is seasoned with the prepper until the tungsten polishing rates of the pad are determined to be within a specified range. A qualifier is run to verify that the tungsten polishing rates are within specification. To cease seasoning the pad with the prepper, the layer of seasoning material 204 is moved away from the pad 106 by lifting the supporting device 201 upwards, relative to the view shown in FIG. 2, away from the pad 106. In other embodiments, the conditioning arm moves in a generally parallel direction with the pad 106 so that the seasoning layer 204 is moved to a position no longer above the pad 106, relative to the view shown in FIG. 2. After the tungsten polishing rate of a polishing pad 106 is within a specified range, a layer of tungsten on a semiconductor wafer 102 is polished with the polishing pad 106, as shown in FIG. 1. In one embodiment, the tungsten layer is planarized to form tungsten plugs on the wafer.

Because the tungsten polishing rates for a polishing pad decline while the pad is idle, the prepper is used to season a pad to bring the tungsten polishing rates within a specified range before a new batch of wafers is polished. The pad is typically idle when the polisher is in between polishing a batch of wafers or between polishing multiple batches of wafers. Typically a batch includes one to five wafers. In one embodiment, after the excess tungsten on the new batch of wafers is removed by polishing, the pad is seasoned again by the prepper to bring or maintain the tungsten polishing rates within a specific range before a second new batch is polished with the pad. In other embodiments, the prepper is used to season the pad during a period when the pad is idle that may occur between polishing multiple batches of wafers.

Figure 3:
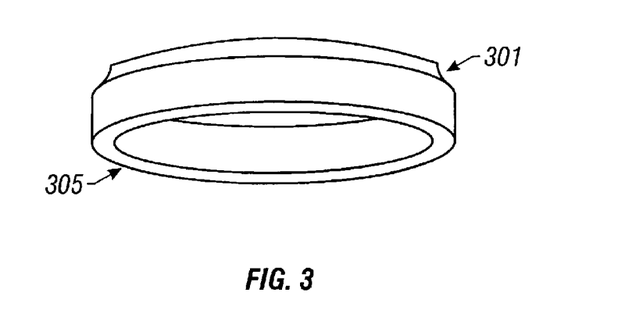
FIG. 3 is a perspective view of one embodiment of a supporting device portion of a prepper.

FIG. 3 shows a perspective view of one embodiment of a supporting device portion of a prepper. In the embodiment shown, supporting device 301 is a core made of a stainless steel material having a ring form. In other embodiments, the core may be made of other materials such as other metals. In the embodiment shown in FIG. 3, core 301 includes a first surface 305 located on the bottom side of the supporting device, relative to the view shown in FIG. 3. Surface 305 is a smooth and planar surface having a ring form. Surface 305 faces the pad 106 when the prepper is seasoning the polishing pad. The seasoning layer is formed on surface 305. In the embodiment shown, surface 305 is integral with the support device 301. However, in other embodiments, the seasoning layer may be formed on a surface of a seasoning substrate or substrates having a form of portions of a ring. The substrate and attached seasoning material would then be secured to the core with screws, rivets, or by TIG welding or by other types of securing devices or techniques. The support device 301 includes mounting holes or other mounting devices (not shown) to secure the support device 301 to axis 215 (See FIG. 2).

Figure 4:
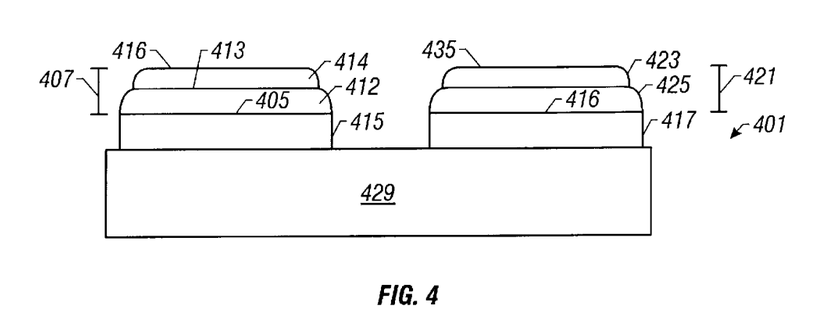
FIG. 4 is a side view of one embodiment of a prepper with multiple seasoning layers.

Referring to FIG. 4, seasoning layers or layers of seasoning material 407 and 421 are shown attached to surfaces 405 and 416 respectively of the supporting device 401. In the embodiment shown, supporting device 401 includes a core made of a stainless steel material and two seasoning substrates 415 and 417 attached to the core. In the embodiment shown, substrates 415 and 417 are also made of a stainless steel material. In one embodiment, substrates 415 and 417 are made of 316 stainless steel. Surfaces 405 and 416 are located on substrates 415 and 417, respectively, and generally lie in the same horizontal plane relative to the view shown in FIG. 4.

In the embodiment shown, seasoning layers 407 and 421 are flame sprayed on surfaces 405 and 416, respectively. Flame spraying is a process where a metal is vaporized and then sprayed on a surface. When the metal cools, the metal adheres to the surface on which it was sprayed. In the embodiment shown, the seasoning material is vaporized and then sprayed on surface 405 with commercially available flame spraying equipment.

In the embodiment shown, the seasoning layers 407 and 421 are attached to the substrates 415 and 417 respectfully before the substrates 415 and 417 are secured to the core. Before flame spraying, surfaces 405 and 417 are cleaned. A first layer of seasoning material 412 is flame sprayed "directly on" surface 405 of substrate 415. Afterwards, surface 413 of the first flame sprayed layer 412 is lapped to make that surface 412 smooth and planar. After seasoning layer 412 is lapped, another layer of seasoning material 414 is flame sprayed on the lapped side 413 of seasoning layer 412. Surface 416 of layer 414 is also lapped to planarize the surface. In the embodiment of FIG. 4, only two seasoning layers 414 and 412 are attached to the seasoning substrate. However, other embodiments may include more than two layers with each succeeding layer applied in a similar manner. Consequently, the thickness of seasoning layer 407 may be increased by flame spraying consecutive layers of seasoning material on the surface of the previously flame sprayed layer of seasoning material. Thin seasoning layers 423 and 425 are applied to substrate 417 in a similar manner as with layers 414 and 412 to substrate 415.

In the embodiment shown, the thickness of seasoning layer 407 is approximately 40 mils. Each of the flame sprayed thin layers 412 and 414 are initially 25 mils thick when sprayed but are lapped down to 20 mils. However, in other embodiments, the thickness of the seasoning layer may vary. Also in other embodiments, the thickness and number of the thin, flame sprayed layers may also vary. Surface 416 of layer 407 and surface 435 of layer 423 contact a polishing pad when the prepper is seasoning the pad.

In the embodiment shown, seasoning layers 407 and 421 are of a made of a material that is 70% tungsten and 30% nickel by weight. However, the percentage of tungsten in the flame sprayed seasoning material may vary from less than 50% up to 95%. The nickel in the seasoning material is an adhesion promoter which is used because working with pure or relatively pure tungsten is rather difficult. Nickel is a good adhesion promoter in that it is not a mobile ion such that it would adversely affect wafers being polished subsequent to the seasoning. However, in other embodiments, other types of materials may be used as adhesion promoters.

As a new pad polishes tungsten-layer wafers, the tungsten polishing rate of the pad increases. However, the polishing of tungsten by a polishing pad creates polishing by-product such as agglomerated abrasives and oxidized tungsten particles. These polishing by-products can become attached to the pad and scratch the surface of the wafer being polished. Thus, during the tungsten polishing of a batch of wafers, a pad is periodically conditioned to remove this by-product.

Figure 5:
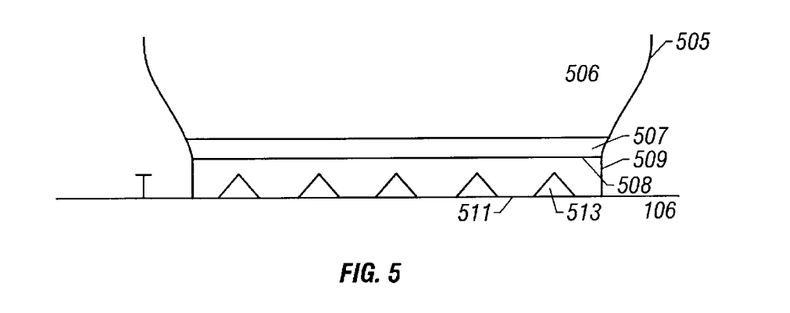
FIG. 5 is a side view of one embodiment of a prepper that also conditions a polishing pad.

Referring to FIG. 5, in some embodiments, the prepper is used to condition a pad by aiding in the removal or dislodging of polishing by-product from the pad 106. In the embodiment shown in FIG. 5, grooves 513 are cut into the surface 511 of the seasoning layer 509 that contacts the polishing pad 106 during the seasoning of the polishing pad. During the seasoning of the pad 106 with the prepper, grooves 513 aid in the removal of or the dislodging of the polishing by-product from the pad 106. The polishing byproduct can scratch the surface of the wafer during polishing.

The ability to concurrently condition a pad and season the pad for polishing tungsten advantageously reduces the amount of time for polishing multiple batches of tungstenlayered wafers. For example, the prepper shown in FIG. 5 is used to condition a polishing pad to aid in removing the excess by-product particles that scratch a wafer during polishing. During conditioning of the pad, the layer of seasoning material 509 is pressed against the pad 106 to transfer tungsten and tungsten by-product to the pad to chemically season the pad. Because tungsten is transferred to the pad during conditioning of the pad, the tungsten polishing rates of the pad do not diminish from a lack of tungsten or tungsten by-product being present on a pad for a period of time during conditioning.

Another advantage of a combination prepper and conditioner is that seasoning by-product that scratches a wafer is removed or dislodged while the pad is seasoned with the prepper. In seasoning a pad with a prepper to polish tungsten, by-product from the seasoning layer 509 and the tungsten slurry build up on the pad. Consequently, before the tungsten on any semiconductor wafer is polished using a new polishing pad, the pad already contains polishing by-product from the seasoning of the pad that could scratch a wafer. By enabling the prepper to also condition a pad, polishing by-product produced from seasoning that could scratch the wafer is removed or dislodged from the polishing pad 106 during the seasoning of the pad. On the other hand, if "dummy" wafers are used to season a pad to within the specified tungsten polishing ranges, the by-products from the dummy wafers that could scratch a wafer being polished are not removed.

In the embodiment shown in FIG. 5, grooves 513 are cut into the surface of side 511 of seasoning layer 509 after the seasoning layer is flame sprayed on surface 508. Grooves are water jet cut and have a depth of up to 30 mills. Grooves 513 are alternatively formed by cutting the seasoning layer 509 with a carbon dioxide spray, diamond tips, or a laser.

In the embodiment shown in FIG. 5, supporting device 505 includes a seasoning substrate 507 that is secured to the upper supporting device 506 by screws, TIG welding, or other securing devices or techniques. In the embodiment shown, seasoning substrate 507 is a thin, stainless steel material. Seasoning layer 509 is attached to surface 508 of seasoning substrate 507 by flame spraying. Afterwards seasoning substrate 507 is secured to the upper supporting device 506. In other embodiments, the seasoning substrate has a partial ring form with multiple seasoning substrates secured to the bottom side of the ring shaped core 506, relative to the view shown in FIG. 5. In other embodiments, the seasoning substrate may have other forms or shapes as well.

Figure 6:
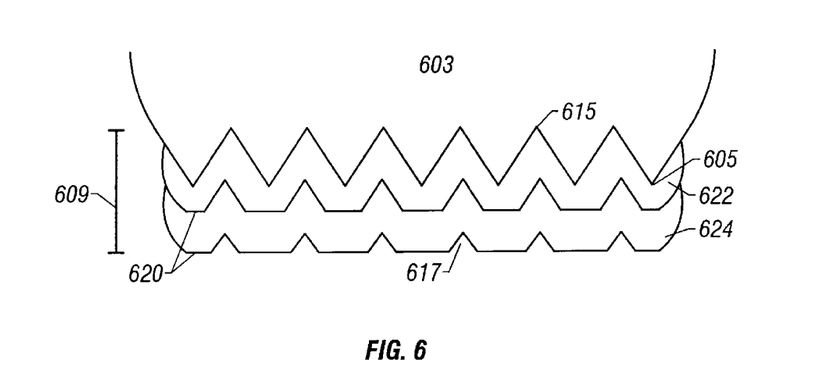
FIG. 6 is a side view of one embodiment of a prepper that also conditions a polishing pad.

FIG. 6 shows a side view of an embodiment of a prepper that is also a pad conditioner. In FIG. 6, supporting device 603 has grooves 615 on surface 605 of the supporting device. When the seasoning layers are flame sprayed onto surface 605, grooves 617 form in the seasoning layer 609 corresponding to the locations of grooves 615. As in the embodiment in FIG. 5, the individually flame sprayed seasoning layers 622 and 624 are lapped in a planar manner. However, due to the recessions made by the grooves 615 on surface 605, only the ridges 620 of flame sprayed layers 622 and 624 are actually lapped during the lapping process. In other embodiments, the surface 605 has other configurations or shapes to give a seasoning layer that is flame sprayed on the surface 605 the ability to condition the polishing pad. In the embodiment shown, grooves 615 have a triangle shape. However, in other embodiments, grooves 615 has other shapes such as a rectangle shape. In other embodiments, the seasoning layer 609 resides completely within the grooves 615 with the bottom surface of the seasoning layer within each groove contacting the polishing pad during the seasoning of the polishing pad. In other embodiments, the seasoning layer 609 is flame sprayed on a seasoning substrate with grooves 615. Afterwards, the seasoning substrate is secured to a core.

Figure 7:
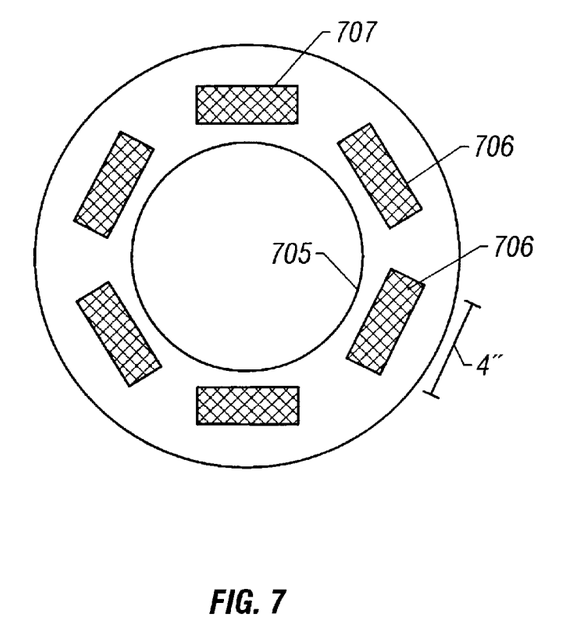
FIG. 7 is a bottom view of one embodiment of a prepper that also conditions a polishing pad.

FIG. 7 shows a bottom view of one embodiment of a prepper that is also a pad conditioner. In this embodiment, the core 705 has the form of a ring similar to that shown in FIG. 3. Seasoning layers 706 are attached to seasoning substrates (not shown) which are secured to the bottom side of the core 705. In the embodiment shown, the circuit side of the seasoning layers 706 have a rectangular shape. The widest dimension of the seasoning layers 706 is about 4 inches. Because the seasoning layer contains tungsten, minimizing the width of the seasoning layer increases the structural integrity of the seasoning layer 706. The bottom sides or circuit sides of the seasoning layers 706, shown in FIG. 7, contact the polishing pad when the prepper is seasoning the pad. Cross-hatched grooves 707 are cut into the bottom sides of seasoning layers 705 as shown in FIG. 7. Grooves 707 aid in conditioning the polishing pad when the prepper is seasoning the polishing pad to polish tungsten. In other embodiments, the grooves may be cut in other patterns.

Figure 8:
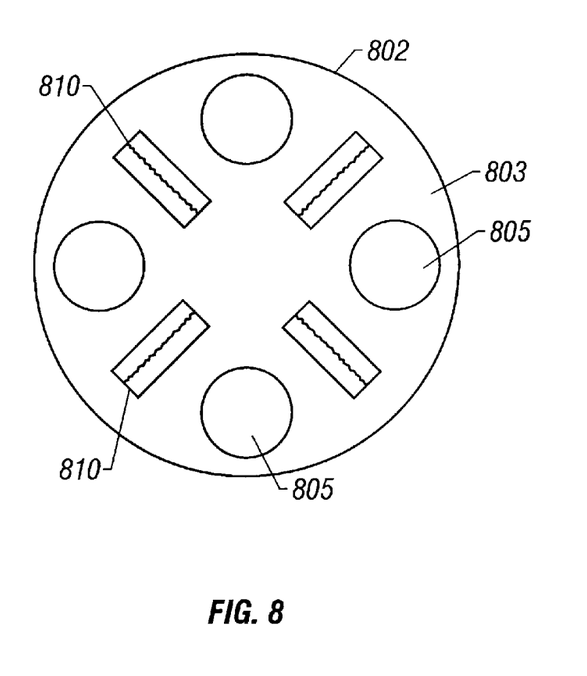
FIG. 8 is a bottom view of one embodiment of a prepper that also conditions a polishing pad.

FIG. 8 shows a bottom view of one embodiment of a prepper that is also a pad conditioner. In the embodiment shown in FIG. 8, the bottom surface 803 of the core 802 has the form of a circular disc. Seasoning layers 805 are attached to seasoning substrates (not shown) which are secured to the bottom side 803 of core 802. In the embodiment shown, seasoning layers 805 have a disk shape. Brushes 810 are attached to the bottom side 803 of the core 802. The brushes condition the polishing pad when the seasoning layers 805 are seasoning the polishing pad. When the circuit sides of seasoning layers 805 are in contact with the polishing pad, the brushes 810 are in a position with respect to the pad for removing polishing byproduct when the pad and prepper are rotated with respect to each other. In one embodiment, brushes 810 are polypropylene brushes or other types of inert brushes.

In other embodiments, the surface of the seasoning layer has other forms. The grooves may be cut in the layer of seasoning material in other patterns. In other embodiments, the grooves also have other forms, shapes, and/or dimensions. For example, the grooves in the prepper of FIG. 7 may be cut into an outwardly spiral pattern that moves particles away from the center of the core as the prepper is being rotated. In other embodiments, the bottom side of the seasoning layer is "randomly" roughed up to aid in conditioning the pad when the pad is seasoned by the prepper. In other embodiments, the support device has ridges extending from the bottom side that faces the pad during the seasoning to condition the pad. In other embodiments, the layer of seasoning material has other shapes and/or forms depending on the supporting device and, more particularly, the surfaces of the support device to which the seasoning layers are attached.

Figure 9:
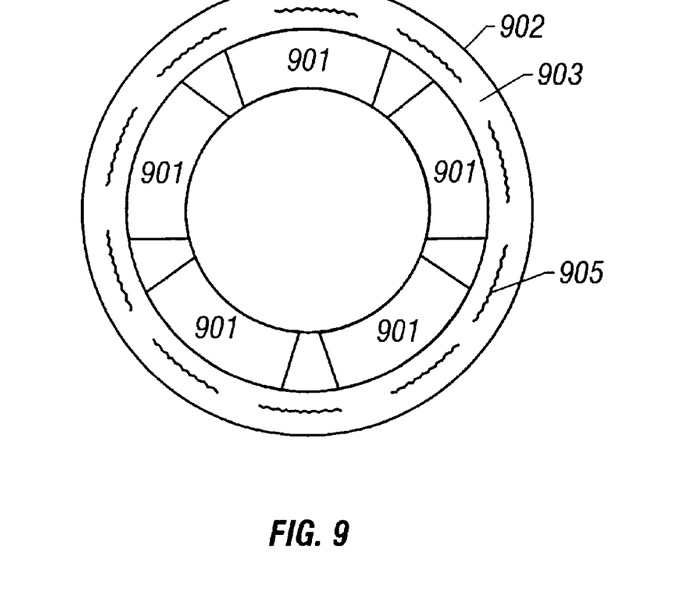
FIG. 9 is a bottom view of one embodiment of a prepper that also conditions a polishing pad.

FIG. 9 is a bottom view of one embodiment of a prepper that is also a pad conditioner. In the embodiment shown, core 902 has the form of a ring. Multiple seasoning layers 901 having a partial ring shape form are secured to the inner portion of the bottom side 903 of core 902 via seasoning substrates (not shown). Attached to the outer portion of the first surface 903 are brushes 905. These brushes condition the pad while the pad is seasoned with the prepper shown in FIG. 9. In other embodiments, the brushes are located on other portions of the surface 903 with respect to the seasoning layers 901. In some embodiments, brushes 905 are attached to the side of the support device of the prepper in such a way that the brushes 901 contact the polishing pad to condition the pad when the pad is seasoned with the prepper.

Figure 9A:
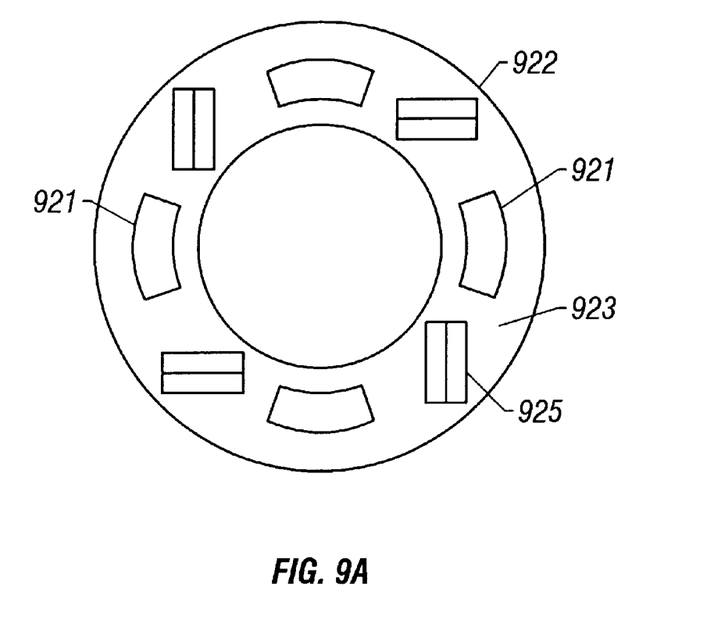
FIG. 9A is a bottom view of one embodiment of a prepper that also conditions a polishing pad.

FIG. 9A is a bottom view of one embodiment of a prepper that is also a pad conditioner. In the embodiment shown, core 922 has the form of a ring. Multiple seasoning layers 921 having a partial ring shape form are secured to the inner portion of the bottom side 923 of core 922 via seasoning substrates (not shown). Secured to the bottom side 923 are rubber bladed squeegees 925 that condition the pad when the seasoning layers 921 are seasoning the pad.

Figure 10:
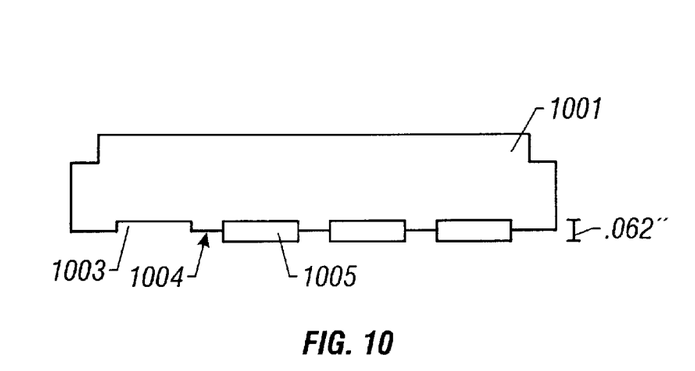
FIG. 10 is a side view of one embodiment of a partially assembled prepper.

FIG. 10 shows a side view of an embodiment of a partially assembled prepper. Notches 1003 are formed on the bottom surface 1004 of supporting device 1001. The notches may be included in the mold of the supporting device or cut into surface 1004 after the supporting device 1001 has been made. Inserted into the three left-most notches 1003, relative to the view shown in FIG. 10, are seasoning layers 1005 which in the embodiment shown are bars of relatively pure tungsten (greater than 95% by weight) having a thickness shown in FIG. 10 of approximately 0.062 inches. However, the seasoning layer may be made of other material with a lesser percentage of tungsten by weight. The tungsten bars are pressed against a polishing pad when the pad is seasoned by the prepper shown in FIG. 10. To attach the tungsten bars 1005 to the supporting device 1001, the supporting device 1001, and particularly the bottom surface 1004, is heated to approximately 1000 degrees F. Afterward, the tungsten bars 1005 are inserted into the notches 1003. The supporting device 1001 and the inserted tungsten bars 1005 are slowly cooled so that the supporting device and tungsten bars cool at the same rate to preserve the integrity of the resulting structure. In one embodiment, the resulting structure is slowly cooled for up to 72 hours before the resulting structure reaches room temperature. When the supporting device 1001 has cooled, the tungsten 1005 is secured within the notches 1003. In other embodiments, the tungsten 1005 may have different arrangements with respect to the support device 1001.

The prepper shown in FIG. 10 may be configured to allow the prepper to condition a pad. In some embodiments, grooves are cut into the seasoning layers 1005 to allow the seasoning layers 1005 to condition the pad during the seasoning of the pad. In other embodiments, the seasoning layers 1005 have other configurations with respect to the supporting device 1001 that allow the seasoning layers to condition the pad. In other embodiments, the seasoning layers 1005 are attached between brushes such as the one shown in FIG. 8, or other types of conditioning equipment such as squeegees.

Figure 12:
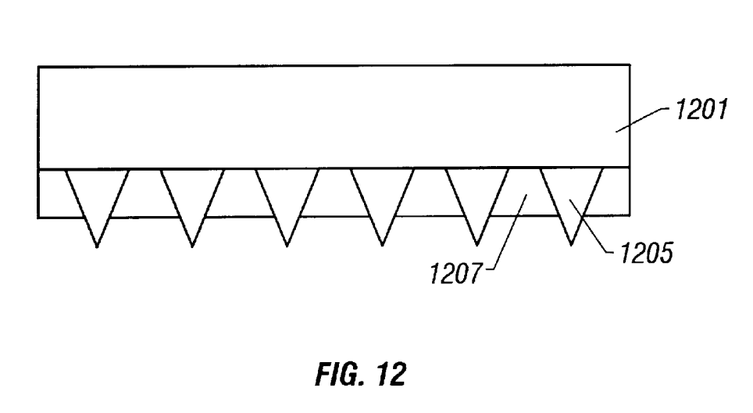
FIG. 12 is a side view of one embodiment of a prepper that also conditions a polishing pad.

FIG. 12 is a side view of one embodiment of a prepper that is also a pad conditioner. The conditioner in FIG. 12 is a diamond coated conditioner wheel. Diamonds 1205, secured to a supporting device 1201, condition a pad when the pad is pressed against the polishing pad. A seasoning layer 1207 is attached to the supporting device and to the diamonds 1205 by CVD or by flame spraying. The seasoning layer is then polished so that the diamonds are exposed from the bottom side or circuit side of the conditioner. In one embodiment, the seasoning layer is a tungsten, nickel composition.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An apparatus for seasoning a polishing pad for polishing tungsten comprising:
   a support device having a first surface; and
   a seasoning layer attached to the first surface of the support device, having a thickness greater than approximately 1 mil, the seasoning layer made of a seasoning material for seasoning a polishing pad with tungsten polishing by-product to polish tungsten;
   wherein the seasoning material comprises at least 65% tungsten and at least 25% nickel.

2. The apparatus of claim 1 further comprising:
   a second seasoning layer attached to a second surface of the support device, having a thickness greater than approximately 1 mil, the second surface of the support device being in a plane generally parallel to the first surface of the support device, the seasoning layer made of a seasoning material for seasoning a polishing pad to polish tungsten.

3. The apparatus of claim 1 wherein the seasoning layer has a partial ring shape.

4. The apparatus of claim 1 wherein the first surface of the support device is a stainless steel material.

5. The apparatus of claim 1 wherein the support device has a form of a ring.

6. The apparatus of claim 1 wherein the seasoning layer has a first side with grooves, the first side contacting the pad during the seasoning of the pad.

7. An apparatus for seasoning a polishing pad for polishing tungsten comprising:
   a support device having a first surface; and
   a seasoning layer attached to the first surface of the support device, having a thickness greater than approximately 1 mil, the seasoning layer made of a seasoning material for seasoning a polishing pad with tungsten polishing by-product to polish tungsten;
   wherein the seasoning layer has a first side with grooves, the first side contacting the pad during the seasoning of the pad;
   wherein the first surface of the support device has grooves.

8. An apparatus for seasoning a polishing pad for polishing tungsten comprising:
   a support device having a first surface; and
   a seasoning layer attached to the first surface of the support device, having a thickness greater than approximately 1 mil, the seasoning layer made of a seasoning material for seasoning a polishing pad with tungsten polishing by-product to polish tungsten;
   wherein the seasoning layer includes a plurality of thin seasoning layers, applied by flame spraying.

9. The apparatus of claim 1 further comprising:
   a brush attached to the support device, the brush being positioned to condition the polishing pad when the seasoning layer is seasoning the polishing pad.

10. The apparatus of claim 9 wherein:
    the brush is located adjacent to the seasoning layer.

11. The apparatus of claim 1 wherein the support device has a second surface in the shape of a disk, the surface in the shape of a disk facing the polishing pad when the seasoning layer is seasoning the polishing pad, the seasoning layer being coupled to the second surface.

12. The apparatus of claim 1 further wherein the apparatus is a chemical mechanical polisher.

13. The apparatus of claim 1 further comprising:

means for conditioning a polishing pad when seasoning layer is seasoning the polishing pad to polish tungsten, the means physically coupled to the support device.

14. The apparatus of claim 13 wherein:

the means for conditioning includes grooves in a first side of the seasoning layer, the first side being in contact with the pad during seasoning of the pad.

15. The apparatus of claim 13 wherein:

the means for conditioning includes a brush.

16. The apparatus of claim 13 wherein:

the means for conditioning includes a squeegee.

17. The apparatus of claim 1, the support device including:

a core; and a seasoning substrate, the first surface located on the seasoning substrate, the seasoning substrate secured to the core.

18. The apparatus of claim 7, wherein the seasoning material comprises up to 95% tungsten by weight.

19. The apparatus of claim 7 wherein the seasoning material comprises at least 50% tungsten by weight.

20. A method for making a prepper for seasoning a polishing pad comprising:

providing a support device having a first surface; and attaching a seasoning layer having thickness of at least 1 mil to the first surface, the seasoning layer made of a seasoning material for seasoning a polishing pad with tungsten polishing by-product;

wherein the seasoning layer is attached by flame spraying a seasoning material on the first surface.

21. A method for making a prepper for seasoning a polishing pad comprising:

providing a support device having a first surface; and attaching a seasoning layer having thickness of at least 1 mil to the first surface, the seasoning layer made of a seasoning material for seasoning a polishing pad with tungsten polishing by-product;

wherein the seasoning layer comprises at least 65% tungsten and at least 25% nickel by weight.

22. The method of claim 20 wherein the attaching the seasoning layer includes:

consecutively flame spraying a plurality of thin layers of a seasoning material on the first surface, wherein the a first thin layer of the plurality of thin layers is flame sprayed on the first surface, the remaining of the plurality of thin layers being flame sprayed on the previously flame sprayed thin layer of seasoning material.

23. The method of claim 22 further comprising:

after flame spraying each thin layer, lapping each thin layer.

24. A method for making a prepper for seasoning a polishing pad comprising:

providing a support device having a first surface; and attaching a seasoning layer having thickness of at least 1 mil to the first surface, the seasoning layer made of a seasoning material for seasoning a polishing pad with tungsten polishing by-product;

wherein the attaching further comprises:
heating the first surface;
inserting a layer of the seasoning material into a notch in the first surface; and
cooling the first surface and seasoning material.

25. The method of claim 24 wherein:

heating the first surface includes heating the first surface to a temperature of approximately 1000° F.; and cooling the first surface and the seasoning material includes cooling the first from a temperature of 1000° F. to approximately room temperature for 36 hours or more.

26. The method of claim 24 wherein the seasoning material is over 95% tungsten by weight.

27. The method of claim 20 further comprising:

securing the first surface to the support device after attaching the seasoning layer to the first surface.

28. The method of claim 20 further comprising:

forming grooves in the first surface.

29. The method of claim 20 further comprising:

cutting grooves in the seasoning layer.

30. The method of claim 20 further comprising:

securing a brush to the support device.

31. The method of claim 20 wherein the seasoning layer is made up of at least 50% tungsten by weight.

32. A method of chemical mechanical polishing of tungsten on a semiconductor wafer comprising:

seasoning a polishing pad with a prepper having a seasoning layer of a seasoning material of at least 1 mil thick to season the polishing pad with tungsten polishing by-product; and polishing tungsten on a first semiconductor wafer with the polishing pad;

wherein the seasoning layer comprises at least 65% tungsten and at least 25% nickel by weight.

33. The method claim 32 wherein the seasoning of the polishing pad further includes:

contacting the polishing pad with the seasoning layer; and removing the seasoning layer from the polishing pad.

34. The method claim 33 wherein the prepper is secured to a conditioning arm;

contacting the polishing pad further includes moving the conditioning arm to contact the polishing pad with the seasoning layer; and removing the seasoning layer further includes moving the conditioning arm.

35. The method of claim 34 wherein polishing tungsten further includes:

positioning a carrier to move a circuit side of the wafer secured to the carrier against the polishing pad; and removing the circuit side of the wafer from the polishing pad by moving the carrier away from the polishing pad.

36. The method of claim 32 further comprising:

polishing tungsten on a second semiconductor wafer with the polishing pad.

37. The method of claim 36 further comprising:

polishing tungsten on a plurality of at least five semiconductor wafers with the polishing pad after the seasoning of the polishing pad with the prepper;

after polishing tungsten on the plurality of wafers, repeating seasoning of the polishing pad with the prepper; and polishing tungsten on a second semiconductor wafer with the polishing pad after repeating seasoning.

38. The method of claim 37 further comprising:

polishing tungsten on a second plurality of at least five semiconductor wafers with the polishing pad after repeating seasoning;

after polishing tungsten on the second plurality, repeating seasoning for a second time of the polishing pad with the prepper; and polishing tungsten on third semiconductor wafer with the polishing pad after repeating seasoning for a second time.

39. The method of claim 37 wherein the repeating seasoning of the polishing pad further includes:

conditioning the pad with the prepper.

40. The method of claim 39 wherein conditioning the pad with the prepper includes dislodging polishing byproducts from the pad with the use of grooves in the first surface of the seasoning layer.

41. The method of claim 39 wherein conditioning the pad with the prepper includes dislodging polishing byproducts from the pad with a brush attached to the prepper.

42. The method of claim 32 wherein the seasoning layer includes at least 50% tungsten by weight.

43. The method of claim 32 wherein the seasoning the polishing pad is continued until the tungsten polishing rate of the pad is above 4000 angstroms per minute.

44. The method of claim 43 wherein the seasoning of the polishing pad further includes:

checking the tungsten polishing rate of the polishing pad.

45. The method of claim 32 further comprising:

concurrently conditioning the pad with the prepper while seasoning.

46. A Chemical Mechanical Polisher comprising:

a polishing pad;

a carrier for holding at least one semiconductor wafer to be polished by the polishing pad;

a conditioning arm;

a prepper attached to the conditioning arm, the prepper including a seasoning layer for seasoning the polishing pad with tungsten polishing by-product to polish tungsten;

wherein the seasoning layer is formed by flame spraying a seasoning material onto a surface coupled to the prepper.

47. The polisher of claim 46 further wherein;

the prepper further includes a conditioning means for conditioning the pad when the prepper is seasoning the polishing pad.

48. The polisher of claim 46 wherein:

the seasoning layer is made of at least 50% tungsten by weight.

49. The apparatus of claim 1 wherein the tungsten polishing byproduct includes tungsten.

50. The apparatus of claim 1 wherein the tungsten polishing byproduct includes a tungsten oxide.

51. The method of claim 20 wherein the tungsten polishing by-product includes tungsten.

52. The method of claim 20 wherein the tungsten polishing byproduct includes a tungsten oxide.

53. The method of claim 32 wherein the tungsten polishing by-product includes tungsten.

54. The method of claim 32 wherein the tungsten polishing by-product includes a tungsten oxide.

55. The Chemical Mechanical Polisher of claim 46 wherein the tungsten polishing by-product includes tungsten.

56. The Chemical Mechanical Polisher of claim 46 wherein the tungsten polishing by-product includes a tungsten oxide.

57. A Chemical Mechanical Polisher comprising:

a polishing pad;

a carrier for holding at least one semiconductor wafer to be polished by the polishing pad;

a conditioning arm;

a prepper attached to the conditioning arm, the prepper including a seasoning layer for seasoning the polishing pad with tungsten polishing by-product to polish tungsten;

wherein the seasoning material comprises at least 65% tungsten and at least 25% nickel.

* * * * *